(12) United States Patent
Hung et al.

(10) Patent No.: US 11,043,573 B2
(45) Date of Patent: Jun. 22, 2021

(54) METHOD OF FABRICATING TANTALUM NITRIDE BARRIER LAYER AND SEMICONDUCTOR DEVICE THEREOF

(71) Applicant: TAIWAN SEMICONDUCTOR MANUFACTURING CO., LTD., Hsin-Chu (TW)

(72) Inventors: Chi-Cheng Hung, Tainan (TW); Yu-Sheng Wang, Tainan (TW); Weng-Cheng Chen, Tainan (TW); Hao-Han Wei, New Taipei (TW); Ming-Ching Chung, Tainan (TW); Chi-Cherng Jeng, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 23 days.

(21) Appl. No.: 16/176,214

(22) Filed: Oct. 31, 2018

(65) Prior Publication Data

US 2019/0067443 A1 Feb. 28, 2019

Related U.S. Application Data

(62) Division of application No. 15/074,991, filed on Mar. 18, 2016, now Pat. No. 10,147,799.

(Continued)

(51) Int. Cl.
*H01L 29/51* (2006.01)
*H01L 29/40* (2006.01)
(Continued)

(52) U.S. Cl.
CPC ...... *H01L 29/517* (2013.01); *H01L 21/28088* (2013.01); *H01L 21/28512* (2013.01);
(Continued)

(58) Field of Classification Search
None
See application file for complete search history.

(56) References Cited

U.S. PATENT DOCUMENTS 8,642,468 B2   2/2014   Ganguli et al.
9,048,183 B2   6/2015   Ganguli et al.
(Continued)

FOREIGN PATENT DOCUMENTS

CN   102918636 A   2/2013
CN   103337469 A   10/2013
TW   201142946 A   12/2011

OTHER PUBLICATIONS

Chen, et al. "Diffusion barrier properties of single- and multilayered quasi-amorphous tantalum nitride thin films against copper penetration" in Journal of Applied Physics 87(12), Jun. 15, 2000, pp. 8473-8482 (Year: 2000).*

(Continued)

*Primary Examiner* — Erik Kielin
(74) *Attorney, Agent, or Firm* — Cooper Legal Group, LLC

(57) ABSTRACT

A method of fabricating tantalum nitride barrier layer in an ultra low threshold voltage semiconductor device is provided. The method includes forming a high-k dielectric layer over a semiconductor substrate. Subsequently, a tantalum nitride barrier layer is formed on the high-k dielectric layer. The tantalum nitride barrier layer has a Ta:N ratio between 1.2 and 3. Next, a plurality of first metal gates is formed on the tantalum nitride barrier layer. The first metal gates are patterned, and then a second metal gate is formed on the tantalum nitride barrier layer.

20 Claims, 5 Drawing Sheets

Related U.S. Application Data

(60) Provisional application No. 62/279,437, filed on Jan. 15, 2016.

(51) Int. Cl.
*H01L 29/49* (2006.01)
*H01L 29/78* (2006.01)
*H01L 21/28* (2006.01)
*H01L 21/285* (2006.01)
*H01L 21/8238* (2006.01)

(52) U.S. Cl.
CPC .... *H01L 21/823842* (2013.01); *H01L 29/401* (2013.01); *H01L 29/4966* (2013.01); *H01L 29/513* (2013.01); *H01L 29/78* (2013.01)

(56) References Cited

U.S. PATENT DOCUMENTS

| | | | |
|---|---|---|---|
| 2003/0147075 A1 | 8/2003 | Otsuki et al. | |
| 2004/0029377 A1 | 2/2004 | Lee et al. | |
| 2004/0175910 A1* | 9/2004 | Pan | H01L 29/4966 438/592 |
| 2005/0054196 A1* | 3/2005 | Wu | H01L 21/76877 438/680 |
| 2005/0205926 A1 | 9/2005 | Chen et al. | |
| 2005/0227441 A1 | 10/2005 | Nakamura et al. | |
| 2005/0277292 A1 | 12/2005 | Peng et al. | |
| 2011/0151655 A1* | 6/2011 | Chan | H01L 21/28079 438/589 |
| 2011/0263115 A1 | 10/2011 | Ganguli et al. | |
| 2012/0256275 A1 | 10/2012 | Huang et al. | |
| 2013/0075833 A1* | 3/2013 | Liu | H01L 21/28008 257/411 |
| 2013/0102142 A1* | 4/2013 | Lee | H01L 29/7843 438/591 |
| 2013/0280900 A1 | 10/2013 | Lai et al. | |
| 2014/0120712 A1 | 5/2014 | Ganguli et al. | |
| 2014/0264867 A1 | 9/2014 | Kuo et al. | |
| 2015/0170974 A1 | 6/2015 | Xu et al. | |
| 2015/0243652 A1 | 8/2015 | Joshi et al. | |
| 2016/0233092 A1 | 8/2016 | Lin et al. | |
| 2017/0040435 A1 | 2/2017 | Lu et al. | |
| 2017/0062282 A1 | 3/2017 | Lin et al. | |

OTHER PUBLICATIONS

Cui, et al., "Evaluation of TaN as the Wet Etch Stop Layer during the 22nm HKMG Gate Last CMOS Integrations", ECS Transactions, vol. 58, Issue 6, Oct. 2013, pp. 111-118.

* cited by examiner

METHOD OF FABRICATING TANTALUM NITRIDE BARRIER LAYER AND SEMICONDUCTOR DEVICE THEREOF

PRIORITY CLAIM AND CROSS-REFERENCE

This application is a divisional of and claims priority of U.S. Non-Provisional application Ser. No. 15/074,991, titled "METHOD OF FABRICATING TANTALUM NITRIDE BARRIER LAYER AND SEMICONDUCTOR DEVICE THEREOF" and filed on Mar. 18, 2016, which claims priority of U.S. Provisional Application Ser. No. 62/279,437, titled "METAL BARRIER DESIGN IN 3D METAL GATE SCHEME" and filed on Jan. 15, 2016. The entire disclosure of U.S. Non-Provisional application Ser. No. 15/074,991 and U.S. Provisional Application Ser. No. 62/279,437 are incorporated herein by reference.

BACKGROUND

Integrated circuit (IC) industry has experienced rapid growth. As the generations of ICs proceeds, the dimension is smaller while the structure is more complex. These advances have increased the standard of IC manufacturing, and development in IC processing and fabricating is needed. In the course of IC evolution, functional density (i.e., the number of interconnected devices per chip area) has increased, while geometry size (i.e., the smallest component that can be created using a fabrication process) has decreased.

This scaling down process gives rise of a few issues, for example, current leakage and material compatibility. Particle penetration and unavoidable depletion effect occur in conventional polysilicon gate. Work function metals have been employed to replace the conventional polysilicon gate. Elevation in gate capacitance and reduction of gate dielectric layer are among the advantage of using metal gate stacks. However, undesired interaction between the metal gate stacks and the underlying dielectric material renders device performance poor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
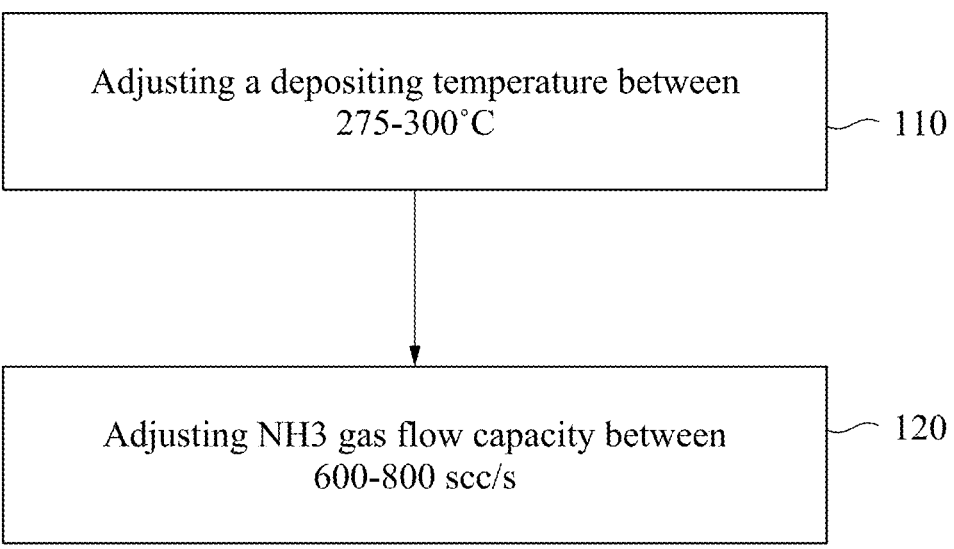
FIG. 1 is a flow chart showing a method of depositing tantalum nitride barrier layer in a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Metal gate structure replaces conventional polysilicon gate electrode, and the dimension of transistors decreases altogether. The thickness of the gate oxide decreases so as to maintain performance with the shrinking gate length. High dielectric constant (high-k or HK) gate insulator layers are used to replace conventional silicon oxide because they can decrease physical limit thickness, reduce leakage current and obtain an equivalent capacitance in an identical equivalent oxide thickness (EOT). However, when a high k dielectric material and a metal are adopted to form a gate stack, various issues may arise in the manufacturing.

A field effect transistor device is considered to be short when the channel length is the same order of magnitude as the depletion-layer widths of the source and drain junction. As the device scales down so as to increase the operation speed and the number of components per chip, the short channel effects arise. When the depletion regions surrounding the drain extend to the source, so that the two depletion layers merge, punch-through or drain-induced barrier lowering (DIBL) occurs. These phenomena are called short channel effect. Obviously, short channel effect can be attenuated with longer channel. However, increase in size is out of the question.

Without compromising chip dimension, short channel effect can be minimized with thinner oxides, larger substrate doping and shallower junction. Given a radius of the junction depth is denoted as R, and the channel length as L. The threshold voltage shift term is proportional to R/L. As a result, this term becomes more prominent for transistors with shorter channel lengths, and it approaches zero for long channel where L is much larger than R. Those devices with smaller geometry have higher drain currents at the same gate-to-source voltage. Hence devices with smaller geometry have lower threshold voltages. In the case of ultra low threshold voltage device, the short channel effect can be even more pronounced.

Threshold voltages largely dictate the speed, standby current and operating current performance characteristics in transistors. The threshold voltage must be set to maximize the "on" current, while minimizing the "off" current. Very often this is a trade off that is determined by the circuit design and application. It is not uncommon that the threshold voltage is adjusted through fine tuning of the doping level in the channel region of the transistors with a threshold voltage adjust implant.

As an alternative method of adjusting threshold voltage, the work function of the gate can be controlled. With the advances of metal gate technologies, the choice of an appropriate work function material is necessary for the transistors. The work function is the energy required to remove an electron from the Fermi level to vacuum. The work function of different materials varies, and N and P type transistor require different work function. Selection of different metal materials may result in additional fabrication steps and increase manufacturing complexity, which, in turn, undermines device performance.

It has been shown that many of the desirable gate metal materials have adhesion and/or stability problems when placed in direct contact with high k dielectrics, such as $HFO_2$ or $ZrO_2$. For example, metals such as Ti, Hf or Zr, scavenge O, reducing the underlying dielectric film, causing degradation and increased leakage. Deposition of a barrier layer (also referred to as a "cap layer") between the metal gate and high k dielectrics can overcome the compatibility problem. Therefore, the material of barrier layer can have determined effect to the overall device performance.

Figure 4A:
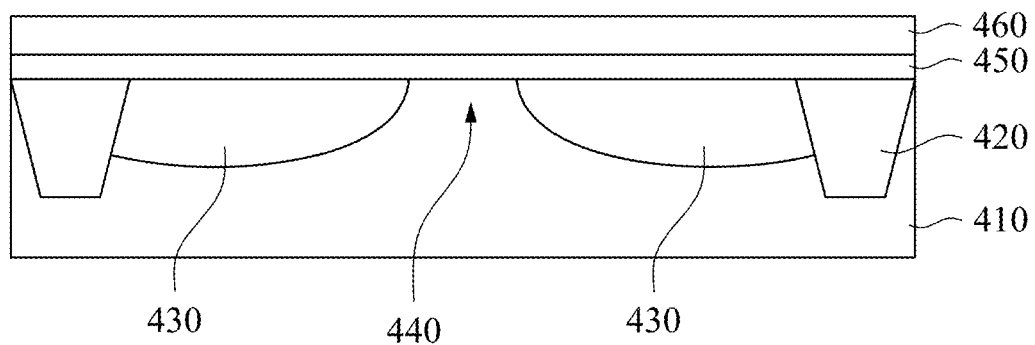
FIGS. 4A-4C are schematic diagrams illustrating embodiments of the method shown in FIG. 2.

Please refer to FIG. 4A. FIG. 4A is a schematic cross-sectional elevation view of a semiconductor device. The semiconductor device includes a substrate 410. The substrate 410 is a semiconductor substrate including silicon. Alternatively or additionally, the substrate 410 includes another elementary semiconductor, such as germanium, a compound semiconductor including silicon carbie, gallium arsenic, gallium phosphide, indium phosphide, indium arsenide, or indium antimonide. The substrate 410 may include an alloy semiconductor, for example, SiGe, GaAsP, AlInAs, AlGaAs, GaInAs, GaInP, GaInAsP or a combination thereof. In yet another alternative, the substrate 410 is a semiconductor on insulator (SOI). The substrate 410 includes various doping configurations depending on design requirements of the device.

An isolation feature 420 is disposed in the substrate 410 to isolate various regions and devices of the substrate 410. The isolation feature 420 utilizes isolation technology, such as local oxidation of silicon (LOCOS) or shallow trench isolation (STI), to define and electrically isolate different regions in the substrate 410. The isolation feature 420 includes silicon oxide, silicon nitride, silicon oxynitride and any other suitable materials. The isolation feature 420 may be formed by any suitable process. For example, forming a shallow trench isolator includes using a lithography process to expose a portion of the substrate, etching a trench in the exposed portion of the substrate and filling the trench with one or more dielectric materials.

Source/drain features 430 are disposed in the substrate 410. The source/drain features 430 may include lightly doped source and drain regions and heavily doped source and drain regions. The lightly and heavily doped source and drain regions may be formed by ion implantation or diffusion or n-type dopants, such as phosphorous or arsenic, or p-type dopants, such as boron or BF2. An annealing process may be performed to activate dopants in the source/drain regions 430. A channel region 440 is defined in between the source/drain regions 430.

A high-k dielectric layer 450 is disposed over the substrate 410. The high-k dielectric layer 450 may have a thickness between 5 Å and 30 Å. Materials of the high-k dielectric layer 450 includes, for example, $HfO_2$, HfSiO, HfSiON, HfTaO, HfTiO, HfZrO, zirconium oxide, aluminium oxide, hafnium dioxide-alumina ($HfO_2$—$Al_2O_3$) alloy, or any other suitable high-k dielectric materials. The formation of the high-k dielectric layer 450 includes deposition, lithography patterning, etching and other suitable processes. The deposition may include physical vapor deposition (PVD), chemical vapor deposition (CVD), atomic layer deposition (ALD), plasma enhanced CVD (PECVD), remote plasma CVD (RPCVD), molecular organic CVD (MOCVD), sputtering, plating or combination thereof. The lithography patterning includes resist coating, soft baking, mask aligning, exposure, post-exposure baking, developing the photoresist, rinsing, drying. The etching includes dry etching and wet etching.

After the formation of high-k dielectric layer 450, a tantalum nitride barrier layer is formed. FIG. 1 is a flow chart showing a method 100 of depositing tantalum nitride barrier layer in a semiconductor device, in portion or entirety, according to various aspects of the instant disclosure. The method 100 begins at operation 110 where a depositing temperature is adjusted.

The tantalum nitride barrier layer 460 is formed by atomic layer deposition or chemical vapor deposition. When depositing the tantalum nitride barrier layer 460, a depositing temperature is adjustable. The depositing temperature in the processing chamber has pivotal effect on the tantalum nitride ratio. As previously discussed, a metal barrier layer is required in between the high-k dielectric layer and the metal gate, and the material of the metal barrier layer is related to the device performance because the particles in the metal barrier layer may react with the metal gate. It is found that nitrogen rich metal barrier layer is prone to induce nitrogen-titanium interaction. This undesired interaction leads to higher etching rate in the metal gate during fabricating process. Undesired anisotropic etching can cause severe device defect, for example, poor conduction or uneven surface. The ratio of tantalum and nitrogen in the barrier layer 460 therefore plays key role in the device performance. The tantalum nitride barrier layer 460 facilitates metal gates binding to the underlying high-k dielectric layer 450, and, at the same time, its content concentration has to be carefully controlled to avoid further interaction.

The concentration of tantalum and nitrogen in the tantalum nitride barrier layer 460 is manipulated by temperature and gas flow capacity. In some embodiments of the instant disclosure, the tantalum nitride barrier layer 460 is formed by ALD. In operation 110, the deposition temperature in the chamber is finely tuned. A higher deposition temperature leads to higher nitrogen concentration. That is, the tantalum to nitrogen (Ta:N) ratio is lower, dropping to less than 1.3. When a lower deposition temperature is applied, the nitrogen concentration decreases, and the tantalum to nitrogen ratio increases. For example, when the deposition temperature is set for 275° C., the tantalum to nitrogen ratio is approximately 1.3. When the deposition temperature decreases to about 250° C., the tantalum to nitrogen ratio comes to approximately 1.4 because the nitrogen concentration falls. As the deposition temperature climbs to 300° C., the tantalum to nitrogen ratio increases to 1.6. The deposition temperature and Ta:N ratio is in inverse proportion. A higher deposition temperature implies a lower Ta:N ratio, while a lower deposition temperature suggests a higher Ta:N ratio.

Another approach to tune the ratio of tantalum and nitrogen is by gas flow capacity, namely the $NH_3$ gas flow, as shown in FIG. 1, operation 120. Unlike the deposition temperature, when the $NH_3$ gas flow capacity increases, the concentration of nitrogen in the tantalum nitride barrier layer 460 increases. For example, when the $NH_3$ gas flow capacity is set for at 800 ml/m (standard cubic centimeters per minute, SCCM), the tantalum to nitrogen ratio is close to 1. If the $NH_3$ gas flow capacity decreases to 600 ml/m, the nitrogen concentration drops altogether, and the tantalum to nitrogen ratio climbs up to above 1.4. By manipulating the $NH_3$ gas flow capacity, the tantalum nitride barrier layer can have a finely tuned tantalum to nitrogen concentration.

The adjustment of deposition temperature and the $NH_3$ gas flow capacity may take turns or performed simultaneously. The action sequence does not affect the resulting tantalum nitride barrier layer concentration. In order to arrive at a desired Ta:N ratio, it can be either adjusting the deposition temperature or adjusting $NH_3$ gas flow capacity alone. Furthermore, the adjustment may take place in multi steps. For example, the deposition temperature adjustment may be repeated at least twice in either the same conditions or different conditions. It also applies to the adjustment of $NH_3$ gas flow capacity where the gas flow capacity may be conducted in more than once. The multiple cycles suggest that the tantalum nitride barrier layer may include more than one layer, and each layer may have slightly different composition determining upon the reaction conditions. As one example, in a first cycle, the deposition temperature is set as 275° C. and the $NH_3$ gas flow capacity at 500 ml/m. In a following cycle, the deposition temperature remains the same, while $NH_3$ gas flow capacity increases to 600 ml/m. The conditions vary according to desired tantalum to nitrogen ratio requirement of the semiconductor device. The final thickness of the tantalum nitride barrier layer ranges between 15 and 20 Å.

Combining the effect of deposition temperature in the chamber and the $NH_3$ gas flow capacity, the tantalum nitride barrier layer may have a Ta:N ratio ranging between 1.2 and 3. Nitrogen concentration is purposefully suppressed so as to attenuate its adverse reaction with neighbouring elements, for example, titanium (Ti) from the overlying metal gate. Dielectric leakage can be minimised when the nitrogen concentration in the tantalum nitride barrier layer is finely tuned to a lesser degree. The tantalum nitride barrier layer can act as a capping layer that facilitates binding and prevents oxygen scavenge. More specifically, by interrupting the conventional 1:1 tantalum to nitrogen ratio, the nitrogen concentration is less in the tantalum nitride barrier layer 460 such that the interaction between the nitrogen in the tantalum nitride barrier layer 460 and the overlying metal gate can be reduced. Moreover, the element in the metal gate, for example, Ti, is less likely to penetrate the tantalum nitride barrier layer 460, and the underlying high-k dielectric layer 450 is protected from oxygen vacancy occupation. In short, the tantalum nitride barrier layer 460 has a tantalum to nitrogen ratio larger than 1.2, and this ratio discourages particle diffusion among different layers. As a result, dielectric leakage is greatly minimized.

Figure 3:
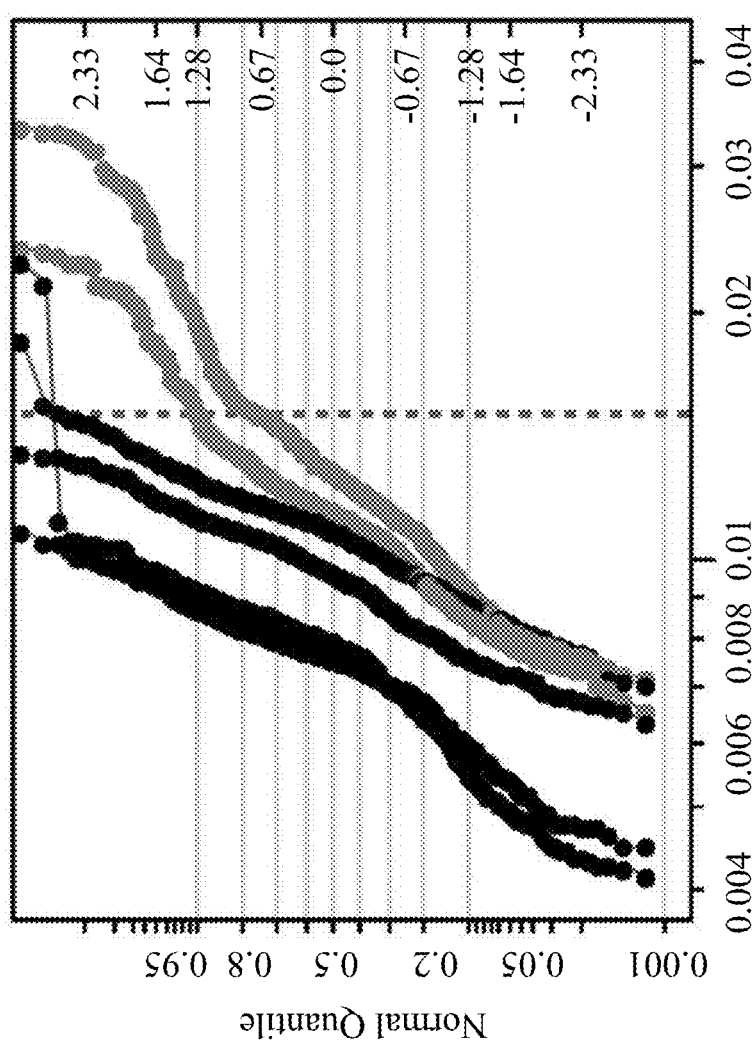
FIG. 3 is a graph showing the mapping of device leakage current on a wafer.

Attention is now invited to FIG. 3. FIG. 3 shows a graph providing information about the device leakage current when the tantalum nitride barrier layer 460 is used. The lighter grey lines are the data collected from a wafer without the tantalum nitride barrier layer. The darker grey lines are the data collected from a wafer employing the tantalum nitride barrier layer 460 in the device. The dotted line cutting through between the 0.01 and 0.02 represents a standard value of device leakage current at ampere (A). In the presence of the tantalum nitride barrier layer 460, the device shift to the left of the standard value, which suggests a less nitrogen induced metal ion diffusion and therefore less dielectric leakage. The driven current is much more stable when the nitrogen atom concentration in the tantalum nitride barrier layer is adjusted to a lower end.

Figure 2:
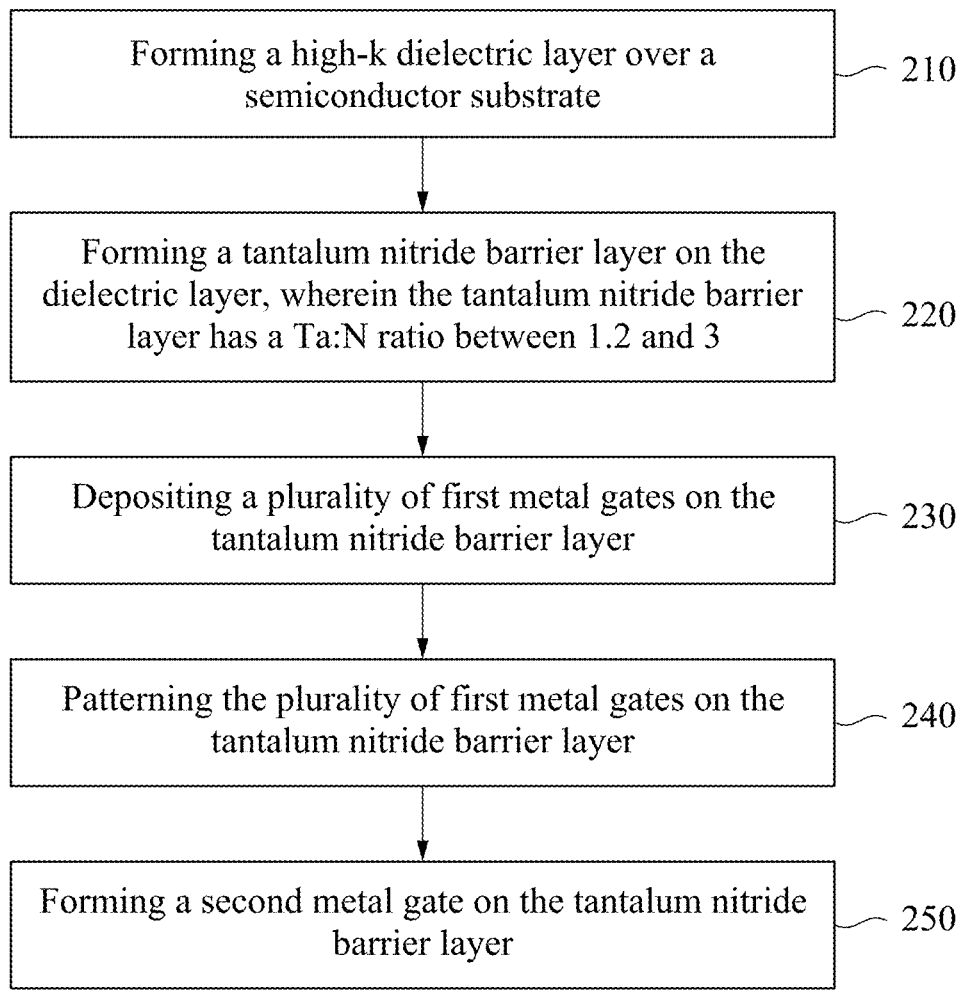
FIG. 2 is a flow chart showing fabricating tantalum nitride barrier layer in an ultra low threshold voltage semiconductor device in accordance with some embodiments of the instant disclosure.

Attention is now invited to FIG. 2, illustrating a method 200 of fabricating tantalum nitride barrier layer in an ultra low threshold voltage semiconductor device, in portion or entirety, according to various aspects of the instant disclosure. As previously discussed, threshold voltage is affected by short channel effect, including punch-through and drain-induced barrier lowering. The selection of materials has pivotal effect to the device performance in the ultra low threshold voltage because undesired material interaction, for example, nitrogen and titanium, may prevent device performance to its full.

Figure 4B:
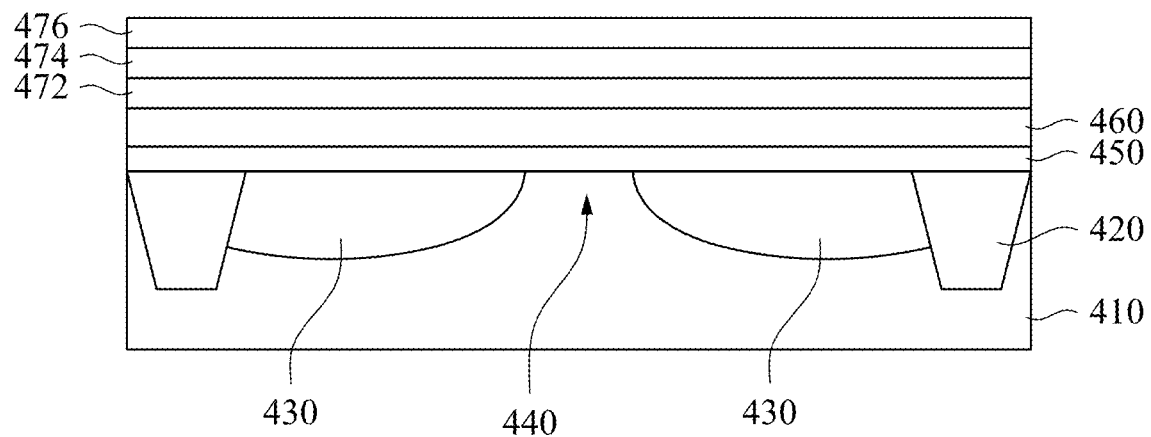
Figure 4C:
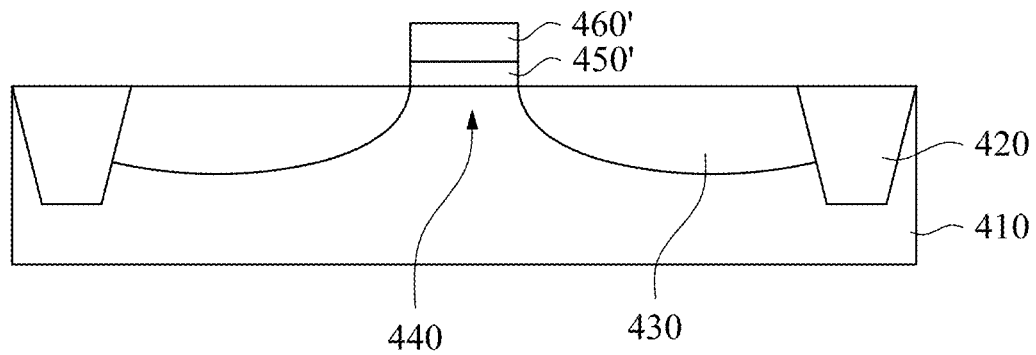

As set forth in operation 210 of FIG. 2, a high-k dielectric layer is formed over a semiconductor substrate. This is illustrated in FIG. 4A, where the high-k dielectric layer 450 is formed on the substrate 410. It should be understood that in some embodiments, the substrate 410 includes more than one set of gate stacks. For example, in an ultra low threshold voltage semiconductor device, the number of gate stacks is four, and each of which serves a different function or with a different structure. For the sake of clarity, only one gate stack is shown in FIGS. 4A-4C, and the instant disclosure is not limited thereto. The characteristics of the substrate 410 may be the same as described in operation 110 of FIG. 1, and it is not repeated to avoid redundancy. A channel region 440 is defined in between the source/drain regions 430. In some embodiments, the high-k dielectric layer 450 covers at least the channel region 440 over the substrate 410. As shown in FIG. 4A, the high-k dielectric layer 450 is formed on the entire surface of the substrate 410, covering the channel region 440, source/drain regions 430 and isolation features 420.

Next, as set forth in operation 120, the tantalum nitride barrier layer is formed on the high-k dielectric layer. This is also illustrated in FIG. 4A. The tantalum and nitrogen ratio is controlled between 1.2 and 3. The ratio is fine tuned through the processing conditions. More specifically, heat and gas flow capacity determines the ratio of tantalum to nitrogen. By adjusting the deposition temperature in the reaction chamber, the resulting tantalum and nitrogen concentration can be altered. With higher temperature, the concentration of nitrogen increases. When the reaction is taking place in a lower temperature, for example, 275° C., the nitrogen concentration is lower, leading to a tantalum and nitrogen ratio higher than at least 1.2. In addition to temperature adjustment, $NH_3$ gas flow capacity adjustment results in changes in the ratio. In some embodiments, the $NH_3$ gas flow capacity is set as approximately 600 ml/m, and the nitrogen concentration can be kept low. For example, at 600 ml/m, the ratio of tantalum to nitrogen is close to 1.4. If the gas flow capacity increases, the nitrogen concentration increases, and the ratio drops to lower than 1.2.

As set forth in operation 230, in the case of ultra low threshold voltage semiconductor device, after the formation of the tantalum nitride barrier layer, more metal gates are formed on the tantalum nitride barrier layer. This is illustrated in FIG. 4B, where a plurality of first metal gates 472, 474 and 476 are deposited on the tantalum nitride barrier layer 460. The first metal gates 472, 474 and 476 are deposited by, for example, PVD, CVD, ALD, PECVD, RPCVD, MOCVD, sputtering, plating, or any other suitable methods.

As set forth in operation 240, the first metal gates 472, 474 and 476 are patterned according to the design of the ultra low threshold voltage semiconductor device. Each of the first metal gates serves different work functions in varied gate stacks, and in some embodiments, the first metal gates are made of TiN. The tantalum nitride barrier layer 460 blocks titanium diffusion to the high-k dielectric layer 450. The low nitrogen concentration in the tantalum nitride barrier layer 460 minimizes nitrogen and titanium interaction, which leads to oxygen scavenge in the high-k dielectric layer 450. Titanium of the first metal gates 472, 474 and 476 is prevented from invading to the high-k dielectric layer 450, and dielectric leakage is greatly reduced. In addition, during the first metal gates 472, 474 and 476 patterning, the etching rate is more uniform because titanium atoms are retained in the first metal gates 472, 474 and 476 with minimum interaction with nitrogen from the tantalum nitride barrier layer 460. In other words, the interface between the first metal gates and the tantalum nitride barrier layer is clean because low-concentration nitrogen in the tantalum nitride barrier layer is unlikely to induce titanium and nitrogen reaction. The patterning of the first metal gates 472, 474 and 476 may take place in between the deposition of each of the first metal gates, and the instant disclosure is not limited thereto.

As set forth in operation 250, after the patterning, a chemical mechanical polishing (CMP) may be performed to remove the first metal gates 472, 474 and 476 on one of the gate structure until the tantalum nitride barrier layer is exposed. This is illustrated in FIG. 4C, where the first metal gates 472, 474 and 476 are removed from one of the four gate stacks. As a result, one of the gate stacks is clear of the first metal gates and available for further processing. For example, patterning may be performed such that the tantalum nitride barrier layer 460' and the high-k dielectric layer 450' acting as a foundation of a gate stack. In some embodiments, the first metal gates 472, 474 and 476 are the conductive features in the other three gate stacks of the ultra low threshold voltage semiconductor device, and a fourth gate has a second metal gate. As set forth in operation 250, the second metal gate is disposed on the tantalum nitride barrier layer 460' to form the fourth gate stack.

In some embodiment, after the deposition of the first and second metal gates, a blocking layer (not shown) may be deposited on the gate stacks by, for example, PVD, CVD, PECVD, RPCVD, MOCVD or any other suitable methods. The material of the blocking layer may be, for example, titanium nitride (TiN). A tungsten layer (not shown) is disposed on the blocking layer to complete the ultra low threshold voltage semiconductor device.

Figure 5:
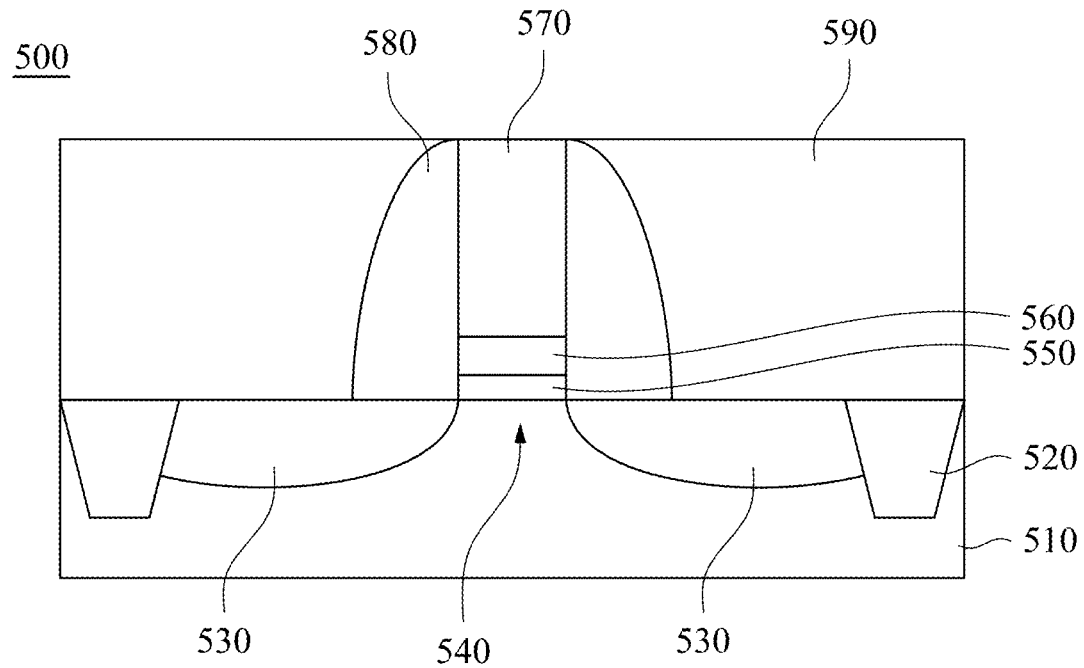
FIG. 5 is a schematic diagram illustrating a metal gate stack in accordance with some embodiments of the instant disclosure.

Attention is now invited to FIG. 5. FIG. 5 illustrates a portion of semiconductor device where a metal gate stack 500 is shown. The metal gate stack 500 includes a substrate 510, a gate structure and a dielectric layer 590. The substrate 510 includes a source/drain regions 530 and a channel region 540 is defined in between the source/drain regions 530. Isolation features 520 are disposed on either side of the source/drain regions 530 to isolate the gate stack from the other functional gate structure on the substrate 510. A high-k dielectric layer 550 is disposed over the channel region 540 on the substrate 510. A tantalum nitride barrier layer 560 is disposed on top of the high-k dielectric layer 550. The tantalum nitride barrier layer 560 has a tantalum and nitrogen ratio ranging between 1.2 and 3. The tantalum nitride barrier layer 560 may contain more than one layer. Furthermore, each of the layers may have different tantalum and nitrogen ratio depending upon device design. For example, a first tantalum nitride barrier layer may have a Ta:N ratio of 1.5, and a second tantalum nitride barrier layer has a Ta:N ratio of 2. The Ta:N ratio is flexible and adjustable upon the deposition of the tantalum nitride barrier layer by manipulating the deposition temperature and $NH_3$ gas flow capacity. A thickness of the final tantalum nitride barrier layer is from approximately 15 to 20 Å. The nitrogen atomic concentration in the tantalum nitride barrier layer 560 is purposefully suppressed such that nitrogen induced metal ion migration can be minimized. The oxygen vacancy scavenge in the underlying high-k dielectric layer is therefore reduced because metal ions does not travel far beyond the tantalum nitride barrier layer 560 when free nitrogen is scarcely present.

A metal gate layer 570 is disposed on the tantalum nitride barrier layer 560. A pair of spacers 580 flanks the gate stack in between. The spacers 580 are positioned adjacent sidewalls of the gate stack (high-k dielectric layer 550, the tantalum nitride barrier layer 560 and the metal gate layer 570). The material of the spacers 580 may be, for example, silicon oxide, silicon carbon nitride or combinations thereof. The dielectric layer 590 is disposed over the substrate 510, such as an interlayer (or inter-level) dielectric (ILD) layer. The dielectric layer 590 includes a dielectric material, such as silicon oxide, silicon nitride, silicon oxynitride, tetraehylorthosilicate (TEOS) formed oxide, phosphosilicate galss (PSG), borophosphosilicate glass (BPSG), low-k dielectric material and any other suitable dielectric material. The dielectric layer 590 may be multi-layered with a selection of different dielectric materials. The metal gate stack 500 is then completed.

In one aspect of the instant disclosure, a method of depositing tantalum nitride barrier layer is provided. The method includes adjusting a depositing temperature between 275-300° C. and adjusting $NH_3$ gas flow capacity between 500-700 ml/m.

In another aspect of the instant disclosure, a method of fabricating tantalum nitride barrier layer in an ultra low threshold voltage semiconductor device is provided. The method includes forming a high-k dielectric layer over a semiconductor substrate. Subsequently, a tantalum nitride barrier layer is formed on the high-k dielectric layer. The tantalum nitride barrier layer has a Ta:N ratio between 1.2 and 3. Next, a plurality of first metal gates is formed on the tantalum nitride barrier layer. The first metal gates are patterned, and then a second metal gate is formed on the tantalum nitride barrier layer.

In still another aspect of the instant disclosure, a metal gate stack is provided. The metal gate stack includes a substrate having source/drain regions. A high-k dielectric layer is disposed over the substrate and between the source/drain regions. A tantalum nitride barrier layer is disposed on top of the high-k dielectric layer. The tantalum nitride barrier layer has a Ta:N ratio between 1.2 and 3. A metal gate layer is disposed over the tantalum nitride barrier layer to form a metal gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A metal gate stack, comprising:
 a substrate comprising a first source/drain region and a second source/drain region;
 a high-k dielectric layer disposed over the substrate and between the first source/drain region and the second source/drain region;
 a tantalum nitride barrier layer disposed over the high-k dielectric layer, wherein:
  the tantalum nitride barrier layer comprises a plurality of tantalum nitride layers, a Ta:N ratio of a first tantalum nitride layer of the plurality of tantalum nitride layers is different than a Ta:N ratio of a second tantalum nitride layer of the plurality of tantalum nitride layers, the Ta:N ratio of the first tantalum nitride layer is between 1.2 and 3, the Ta:N ratio of the second tantalum nitride layer is between 1.2 and 3, a difference between the Ta:N ratio of the first tantalum nitride layer and the Ta:N ratio of the second tantalum nitride layer is at least 0.5, and an uppermost tantalum nitride layer of the plurality of tantalum nitride layers has a Ta:N ratio between 1.2 and 3; and a metal gate layer disposed over the tantalum nitride barrier layer.

2. The metal gate stack of claim 1, wherein the tantalum nitride barrier layer has a thickness between 15 and 20 Å.

3. The metal gate stack of claim 1, wherein the uppermost tantalum nitride layer is in contact with the metal gate layer.

4. The metal gate stack of claim 1, wherein:
the second tantalum nitride layer is disposed over the first tantalum nitride layer, and
the Ta:N ratio of the second tantalum nitride layer is greater than the Ta:N ratio of the first tantalum nitride layer.

5. The metal gate stack of claim 1, comprising:
a first spacer; and
a second spacer, wherein:
the metal gate layer is disposed between the first spacer and the second spacer,
the first spacer is in contact with a first sidewall of the tantalum nitride barrier layer, and
the second spacer is in contact with a second sidewall of the tantalum nitride barrier layer disposed diametrically opposite the first sidewall.

6. The metal gate stack of claim 5, wherein the metal gate layer fills an area between the first spacer and the second spacer above the tantalum nitride barrier layer.

7. The metal gate stack of claim 5, wherein the high-k dielectric layer is in contact with a sidewall of the first spacer and a sidewall of the second spacer.

8. The metal gate stack of claim 5, wherein the metal gate layer is in contact with the first spacer and the second spacer.

9. A metal gate stack, comprising:
a first spacer;
a second spacer;
a tantalum nitride barrier layer, wherein:
the tantalum nitride barrier layer consists of a plurality of tantalum nitride layers,
each of the plurality of tantalum nitride layers has a Ta:N ratio between 1.2 and 3,
a difference between the Ta:N ratio of a first tantalum nitride layer of the plurality of tantalum nitride layers and the Ta:N ratio of a second tantalum nitride layer of the plurality of tantalum nitride layers is at least 0.5,
the Ta:N ratio of at least one of the plurality of tantalum nitride layers is between 1.2 and 1.5,
the first spacer is in contact with a first sidewall of the tantalum nitride barrier layer, and
the second spacer is in contact with a second sidewall of the tantalum nitride barrier layer disposed diametrically opposite the first sidewall; and
a metal gate layer disposed over the tantalum nitride barrier layer, wherein an uppermost tantalum nitride layer of the plurality of tantalum nitride layers is in contact with the metal gate layer.

10. The metal gate stack of claim 9, wherein:
the second tantalum nitride layer is disposed over the first tantalum nitride layer, and
the Ta:N ratio of the second tantalum nitride layer is greater than the Ta:N ratio of the first tantalum nitride layer.

11. The metal gate stack of claim 9, comprising:
a high-k dielectric layer disposed between the first spacer and the second spacer and disposed under the tantalum nitride barrier layer.

12. The metal gate stack of claim 11, wherein:
the high-k dielectric layer is in contact with a sidewall of the first spacer and a sidewall of the second spacer, and
the metal gate layer is in contact with the first spacer and the second spacer.

13. The metal gate stack of claim 9, wherein the metal gate layer fills a space between the first spacer and the second spacer defined above the tantalum nitride barrier layer.

14. A metal gate stack, comprising:
a first spacer;
a second spacer;
a tantalum nitride barrier layer, wherein:
the tantalum nitride barrier layer consists of a plurality of tantalum nitride layers,
each of the plurality of tantalum nitride layers has a Ta:N ratio between 1.2 and 3,
a difference between the Ta:N ratio of a first tantalum nitride layer of the plurality of tantalum nitride layers and the Ta:N ratio of a second tantalum nitride layer of the plurality of tantalum nitride layers is at least 0.5,
the second tantalum nitride layer is disposed over the first tantalum nitride layer,
the Ta:N ratio of the second tantalum nitride layer is greater than the Ta:N ratio of the first tantalum nitride layer,
the Ta:N ratio of at least one of the plurality of tantalum nitride layers is between 1.2 and 1.5,
the first spacer is in contact with a first sidewall of the tantalum nitride barrier layer, and
the second spacer is in contact with a second sidewall of the tantalum nitride barrier layer disposed diametrically opposite the first sidewall; and
a metal gate layer disposed over the tantalum nitride barrier layer.

15. The metal gate stack of claim 14, comprising:
a high-k dielectric layer disposed between the first spacer and the second spacer and disposed under the tantalum nitride barrier layer.

16. The metal gate stack of claim 15, wherein an uppermost tantalum nitride layer of the plurality of tantalum nitride layers is in contact with the metal gate layer.

17. The metal gate stack of claim 15, wherein:
the high-k dielectric layer is in contact with a sidewall of the first spacer and a sidewall of the second spacer, and
the metal gate layer is in contact with the first spacer and the second spacer.

18. The metal gate stack of claim 17, wherein an uppermost tantalum nitride layer of the plurality of tantalum nitride layers is in contact with the metal gate layer.

19. The metal gate stack of claim 14, wherein the metal gate layer fills a space between the first spacer and the second spacer defined above the tantalum nitride barrier layer.

20. The metal gate stack of claim 19, wherein an uppermost tantalum nitride layer of the plurality of tantalum nitride layers is in contact with the metal gate layer.

* * * * *